(12) United States Patent
Li et al.

(10) Patent No.: US 11,798,861 B2
(45) Date of Patent: Oct. 24, 2023

(54) INTEGRATED HEAT SPREADER (IHS) WITH HEATING ELEMENT

(71) Applicant: Intel Corporation, Santa Clara, CA (US)

(72) Inventors: Peng Li, Chandler, AZ (US); Kelly P. Lofgreen, Phoenix, AZ (US); Manish Dubey, Chandler, AZ (US); Bamidele Daniel Falola, Chandler, AZ (US); Ken Hackenberg, Plano, TX (US); Shenavia S. Howell, Chandler, AZ (US); Sergio Antonio Chan Arguedas, Chandler, AZ (US); Yongmei Liu, Chandler, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 959 days.

(21) Appl. No.: 16/504,698

(22) Filed: Jul. 8, 2019

(65) Prior Publication Data

US 2021/0013117 A1   Jan. 14, 2021

(51) Int. Cl.
*H01L 23/34* (2006.01)
*H01L 21/48* (2006.01)
*H01L 23/433* (2006.01)
*H01L 23/367* (2006.01)

(52) U.S. Cl.
CPC ........ *H01L 23/345* (2013.01); *H01L 21/4871* (2013.01); *H01L 23/367* (2013.01); *H01L 23/433* (2013.01)

(58) Field of Classification Search
CPC .......................... H01L 23/345; H01L 21/4871
USPC ......................................................... 257/712
See application file for complete search history.

(56) References Cited

U.S. PATENT DOCUMENTS

| 2010/0230805 | A1* | 9/2010 | Refai-Ahmed | ......... H01L 23/36 438/107 |
| 2016/0251993 | A1* | 9/2016 | Yoshikawa | ........... F01N 3/0234 60/284 |
| 2018/0142900 | A1* | 5/2018 | McKee | .................... A21B 2/00 |
| 2018/0203496 | A1* | 7/2018 | Campbell | ............ H05K 3/3436 |

* cited by examiner

*Primary Examiner* — Quoc D Hoang
(74) *Attorney, Agent, or Firm* — Akona IP

(57) ABSTRACT

Embodiments may relate to a microelectronic package that includes a lid coupled with a package substrate such that a die is positioned between the lid and the package substrate. The lid may include a heating element that is to heat an area between the lid and the die. Other embodiments may be described or claimed.

20 Claims, 6 Drawing Sheets

```
┌─────────────────────────────────────────────────────┐
│ Identifying an IHS that includes a face, wherein    │
│ the IHS further includes a heating element that     │
│ is to heat an area adjacent to the face             │
│                      505                            │
└─────────────────────────────────────────────────────┘
                          │
                          ▼
┌─────────────────────────────────────────────────────┐
│ Thermally coupling the IHS to a TIM such that       │
│ the face of the IHS is facing the TIM               │
│                      510                            │
└─────────────────────────────────────────────────────┘
```

Figure 5

INTEGRATED HEAT SPREADER (IHS) WITH HEATING ELEMENT

BACKGROUND

Thermal interface materials (TTMs) may serve as a thermal solution between an integrated heat spreader (IHS) and a die for microelectronic packages. However, through thermal mechanical (TM) stress, bulk crack or delamination of the TIM may degrade the thermal performance of the packages.

BRIEF DESCRIPTION OF THE DRAWINGS

FIG. 5 depicts an example technique for manufacturing a microelectronic package that includes an IHS with a heating element, in accordance with various embodiments.

DETAILED DESCRIPTION

Figure 1:
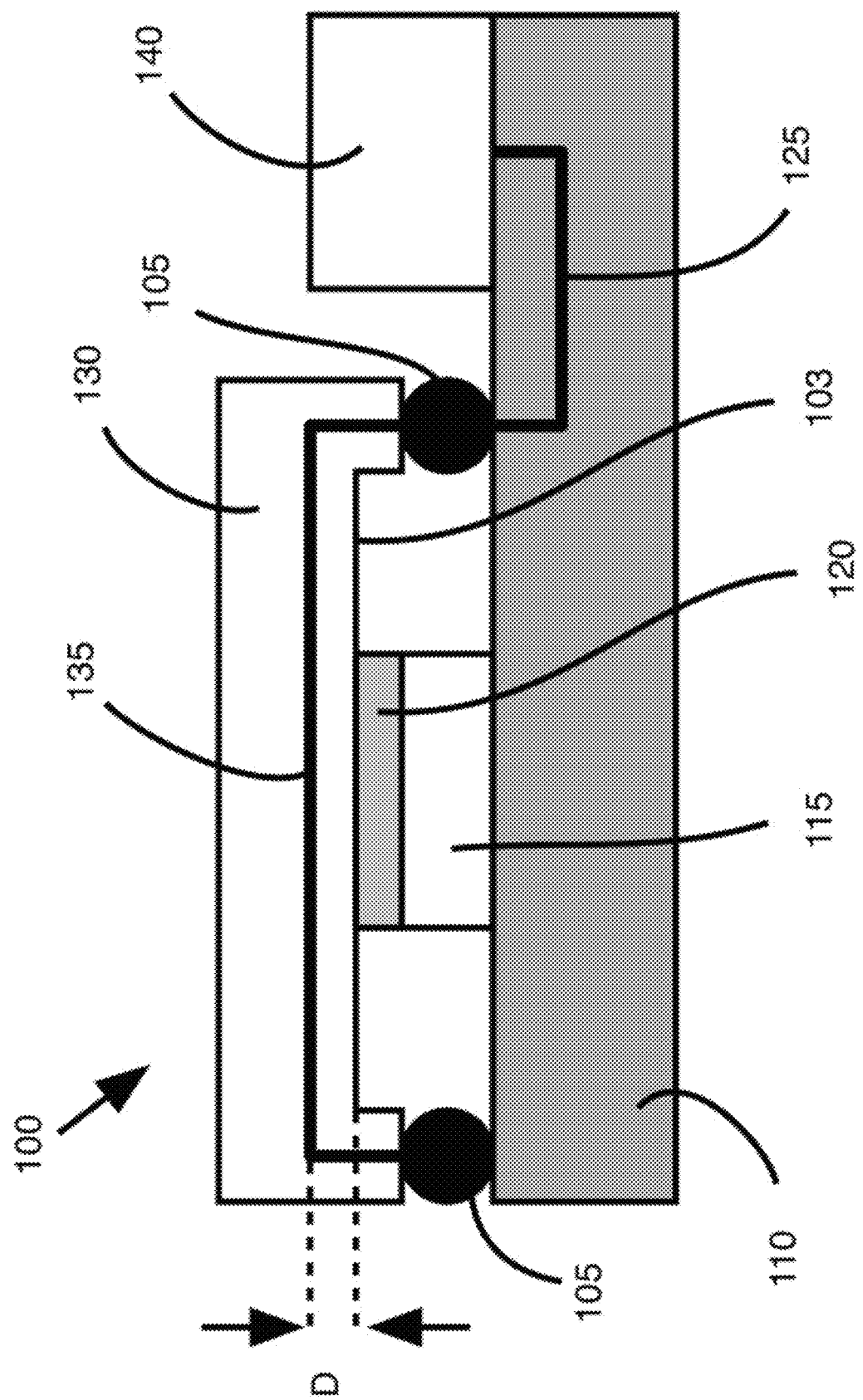
FIG. 1 depicts a simplified example microelectronic package that includes an IHS with a heating element, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabric.

As noted above, TIMs may serve as the thermal solution for microelectronic packages between an IHS and a die. In some embodiments, the TIM may be a solder TIM (STIM). The STIM may be formed of a solder material such as indium or some other material that may reflow, or deform, at a certain temperature. Generally, the STIM may be positioned between a die and an IHS such that it allows thermal communication between the die and the IHS. In some embodiments the STIM may be directly physically coupled with one or both of the die and the IHS, whereas in other embodiments the STIM may not be directly physically coupled with one or both of the die and the IHS, but it may still be in thermal communication with the die and the IHS.

In some embodiments, the microelectronic package may also be referred to as a "semiconductor package." For the sake of consistency, the term microelectronic package will be used herein. Additionally, in some embodiments the IHS may be referred to as a "lid" or an "IHS lid." However, for the sake of consistency herein, the term IHS will be used. Finally, embodiments herein may be described with respect to microelectronic packages that include STIM, however other embodiments may be applicable to microelectronic packages that include a different type of TIM such as polymer TIM (PTIM) or some other type of TIM.

As noted above, through TM stress, bulk crack of the STIM may be one failure mode of the microelectronic package which may degrade thermal performance of the STIM packages. Another failure mode may be delamination of the STIM from the die or the IHS. This failure mode may be particularly common or damaging in environments where the microelectronic package is an element of a server. Embodiments herein may therefore relate to techniques to recover the thermal performance after usage of the microelectronic package. Specifically, embodiments may relate to a "self-healing" thermal solution for a microelectronic package that includes STIM. Embodiments may at least partially recover the thermal degradation, which may result in extending the thermal solution or the useful lifetime of the microelectronic package for server or high-end desktop platforms.

Generally, embodiments herein may relate to an IHS with a heating element therein. The heating element may be configured to provide heat to an area adjacent to the IHS and, more specifically, to the STIM when the IHS is thermally coupled with the STIM. The heat provided by the heating element may at least partially reflow the STIM and reduce or remove some or all of the bulk cracks or other defects present in the STIM. A microelectronic package with such an IHS may be referred to as a "self-healing" package because it is able to mitigate some or all of the thermal degradation of the microelectronic package due to failure of the STIM. Such an IHS may be placed on a microelectronic package of a server, desktop, or client device through a normal lid-attach process. In other embodiments the IHS may be placed on the microelectronic package through solder built on substrate around a sealant gap region. Generally, an end-user may be able to activate the heating element to recover STIM bulk cracks or delamination of the STIM after seeing the thermal performance of the microelectronic package decrease.

FIG. 1 depicts a simplified example microelectronic package 100 that includes an IHS with a heating element, in accordance with various embodiments. The microelectronic package 100 may be referred to as a "self-healing" microelectronic package.

Generally, the microelectronic package 100 may include a die 115 coupled with a package substrate 110. The die 115 may be or include, for example, a processor such as a central processing unit (CPU), general processing unit (GPU), a core of a distributed processor, or some other type of processor. Alternatively, the die 115 may be include a memory such as a DDR memory, a non-volatile memory (NVM), a volatile memory, a read-only memory (ROM), or some other type of memory or die. In some embodiments the die 115 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 115 may include one or more passive components such as capacitors, resistors, etc. The various active or passive components may be positioned within, partially within, or on the surface of the die 115.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110 as will be described in further detail below.

A layer of STIM 120 may be positioned on the die 115. As noted above, the STIM may be formed of a thermally conductive solder material such as indium, tin, indium or tin based binary, ternary, quaternary alloys including materials such as gold, silver, nickel, aluminum, bismuth, etc. Generally, the STIM 120 may be configured to receive thermal energy from the die 115 and convey the thermal energy to an IHS 130. More generally, the STIM 120 may receive thermal energy from localized "hot spots" of the die 115 and then dissipate the energy from the die over a larger area to provide more effective thermal transfer from the die.

As noted, the microelectronic package 100 may further include an IHS 130. The IHS 130 may be thermally coupled with the STIM 120. Specifically, face 103 of the IHS 130 may be thermally or physically coupled with the STIM 120. As shown in FIG. 1, the STIM 120 may be thermally and physically coupled with both the die 115 and the IHS 130, however as previously noted in some embodiments the STIM 120 may be thermally coupled but not physically coupled with one or both of the die 115 and the IHS 130. Generally, the IHS 130 may be formed of a heat dissipating material such as copper, nickel, aluminum, gold, silver, diamond, or gold and silver coated copper, nickel, aluminum, or nickel coated copper and aluminum, etc. In operation, the IHS 130 may receive thermal energy from the STIM 120 and further release the thermal energy. For example, in some embodiments the IHS 130 may be physically or thermally coupled with a heat sink such as a vapor chamber, fins, a liquid cooling heat sink, etc. In other embodiments the IHS 130 may release the thermal energy to the surrounding atmosphere.

In some embodiments, the IHS 130 may be coupled with the package substrate 110 by one or more interconnects 105. As depicted in FIG. 1, the interconnects 105 may be solder bumps of a ball grid array (BGA). In other embodiments the interconnects 105 may be elements of a land grid array (LGA), pins of a pin grid array (PGA), or some other type of interconnect. Generally, the interconnects 105 may physically couple the IHS 130 to the package substrate 110. Additionally, in some embodiments the interconnects 105 may communicatively or electrically couple the IHS 130 to the package substrate 110 as will be discussed in greater detail below.

The IHS 130 may further include a heating element 135. As depicted in FIG. 1, the heating element 135 may be a wire formed out of a material such as copper, nichrome, or some other material. If the heating element 135 is a wire as depicted, the heating element 135 may have a diameter between approximately 30 micrometers ("microns" or "μm") and approximately 300 microns.

It will be understood that in other embodiments the heating element may be some other type of structure than a wire, however the operation of a wire will be generally discussed herein. Generally, when power is applied to the heating element 135, the heating element may emit or produce thermal energy. Specifically, the heating element may 135 may emit heat in an area adjacent to the IHS 130. In this embodiment, the heating element 135 may provide heat to the STIM 120. The heat may cause the STIM 120 to at least partially reflow, which may reduce, eliminate, or otherwise mitigate the cracks or the delamination discussed above.

In order to provide this heat, to the area adjacent to the IHS 130 in general, and the STIM 120 in particular, the heating element 135 may be a distance D from the face of the IHS 130. The distance D may be dependent on factors such as the size of the microelectronic package 100, the thickness of the STIM 120, the thickness or material of the IHS 130, the type of die 115, the thermal requirements of the microelectronic package 100, etc. However, in general, the distance D may be approximately 0.1 millimeters ("mm") and approximately 3.5 mm.

The package substrate 110 may be coupled with or otherwise include a power source 140. The power source 140 may be, for example, a battery or some other type of power source that is configured to provide a direct current (DC) or alternating current (AC) power. The power source 140 may be electrically coupled with the heating element 135. As depicted in FIG. 1, the package substrate 110 may include a communication pathway 125 that is to carry an electrical signal to or from the power source 140. In FIG. 1, the communication pathway 125 is depicted as embedded within the package substrate 110 and including a trace and two generally vertical vias, however in other embodiments the communication pathway 125 may take some other form such as being on the surface of the package substrate 110, including additional pads/traces/vias/etc., include active or passive circuitry, etc. The communication pathway 125 may be coupled with an element of the package substrate 110 such as the interconnect 105 and, through the interconnect 105, to the heating element 135. Activation of the power source 140 may provide power to the heating element 135, which may in turn activate the heating element 135 and facilitate the provision of thermal energy to the STIM 120.

Figure 2:
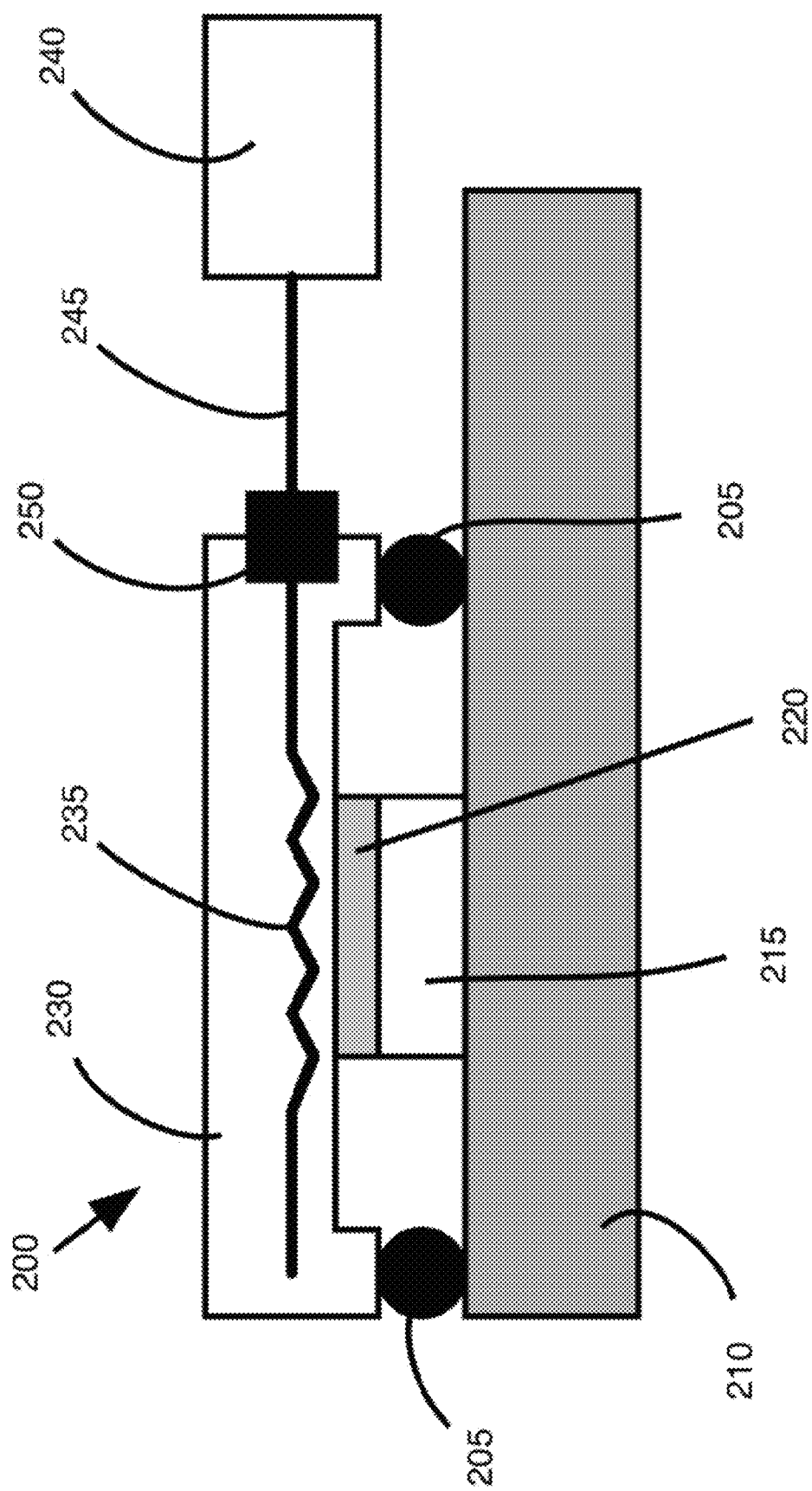
FIG. 2 depicts an alternative simplified example microelectronic package that includes an IHS with a heating element, in accordance with various embodiments.

FIG. 2 depicts an alternative simplified example microelectronic package 200 that includes an IHS with a heating element, in accordance with various embodiments. Generally, the microelectronic package 200 may include an IHS 230, heating element 235, interconnects 205, package substrate 210, die 215, and STIM 220, which may be respectively similar to, and share one or more characteristics of, IHS 130, heating element 135, interconnects 105, package substrate 110, die 115, and STIM 120.

As can be seen, the heating element 235 may not be linear across the length or width of the IHS 230. Rather, the distance of the heating element 235 from the face of the IHS 230 (e.g., element D of FIG. 1) may vary across the length or width of the IHS 230. This variation may be, for example, based on different heat requirements or design requirements of the microelectronic package 200, the IHS 230, the STIM 220, etc. For example, certain portions of the STIM 220 may be more prone to failure than other parts, so increased reflow may be desirable at those portions. It will be understood, however, that this generally saw-tooth variation of the heating element 235 is intended as one example and in other embodiments the varying shape of the heating element 235 may be curved, square, have more or fewer points of variation, etc.

Similarly to heating element 135, heating element 235 may be electrically coupled with a power source 240. The power source 240 may be similar to, and share one or more characteristics of, power source 140. However, as can be seen in FIG. 2, the power source 240 may be decoupled from the package substrate 210. For example, the power source 240 may be coupled with some other element of the computing system of which the microelectronic package 200 is a part.

The power source 240 may be electrically coupled with the microelectronic package by a power connector 245. The power connector 245 may be, for example, an insulated or uninsulated wire, a flexible conductive element, a rigid conductive element, a conductive element of a microelectronic package or package substrate, a combination of the above, or some other type of conductive element. The power connector 245 is shown in a highly simplified configuration as a straight wire, but it will be understood that in other embodiments the power connector 245 may include a plurality of conductive elements, active or passive circuitry (e.g. an amplifier) or some other element.

As can be seen in FIG. 2, the heating element 235 may not be coupled with the power source 240 through the package substrate 210 and the interconnects 205. Rather, the heating element 235 may be coupled to the power source 240 by a connection that is adjacent to the IHS 230 as depicted in FIG. 2. In some embodiments, the IHS 230 may include a port such as port 250. The port 250 is depicted as a highly simplified port in the side of the IHS 230, however, in real-world embodiments the port 250 may have a variety of different shapes, sizes, or configurations. Generally, the port 250 may include a male or female socket which may be mated with a corresponding female or male socket on the power connector 245. In other embodiments, the port 250 may be a cavity in the IHS 230 through which the heating element 235 may be accessed. In some embodiments the port 250 may include a single connector or a plurality of connectors (e.g., a positive terminal, a negative terminal, a ground terminal, some combination thereof, etc.). Although the port 250 is depicted as partially protruding from the IHS 230, in other embodiments the port 250 may be positioned fully within, or fully on the surface of, the IHS 230.

It will be understood that the above-described embodiments are intended as examples of embodiments, and other embodiments may have one or more variations from, or combinations of, the depicted elements. For example, in FIG. 2 the power source 240 may be coupled with the package substrate 210 (as shown in FIG. 1). Other embodiments may include additional elements such as active or passive components coupled with the dies, package substrates, power sources, IHS', various power connectors or communication pathways, heating elements, etc. In some embodiments, the power sources may be in a different location than shown, for example coupled with the IHS, adjacent to the die under the IHS, etc. In some embodiments, the power source 140 may not be on the surface of the package substrate 110, but rather may be at least partially embedded, if not fully embedded, within the package substrate 110.

Other variations may be present as well. As previously noted, in some embodiments the heating element may be some other type of heating element than a wire, or the heating element may include a plurality of wires or components, etc. In some embodiments if the heating element is a wire the wire may have varying thicknesses across the length of the microelectronic package to accommodate for different heat output requirements. In some embodiments, the distance D may vary across the length or width of the microelectronic package to accommodate for different heat output requirements (as depicted, for example, in FIG. 2).

In some embodiments the microelectronic packages may include a plurality of dies, a plurality of STIMs coupled with a single die, a plurality of heating elements within an IHS, etc. In some embodiments, various elements such as the IHS, the STIM, the die, the interconnects, etc. may have different shapes or relative sizes than depicted in the Figures. Some embodiments may include combinations of the various configurations depicted in FIG. 1 or 2. It will be understood that this list of variations is intended as a non-exhaustive list of examples and other variations may be present in other embodiments.

Figure 3:
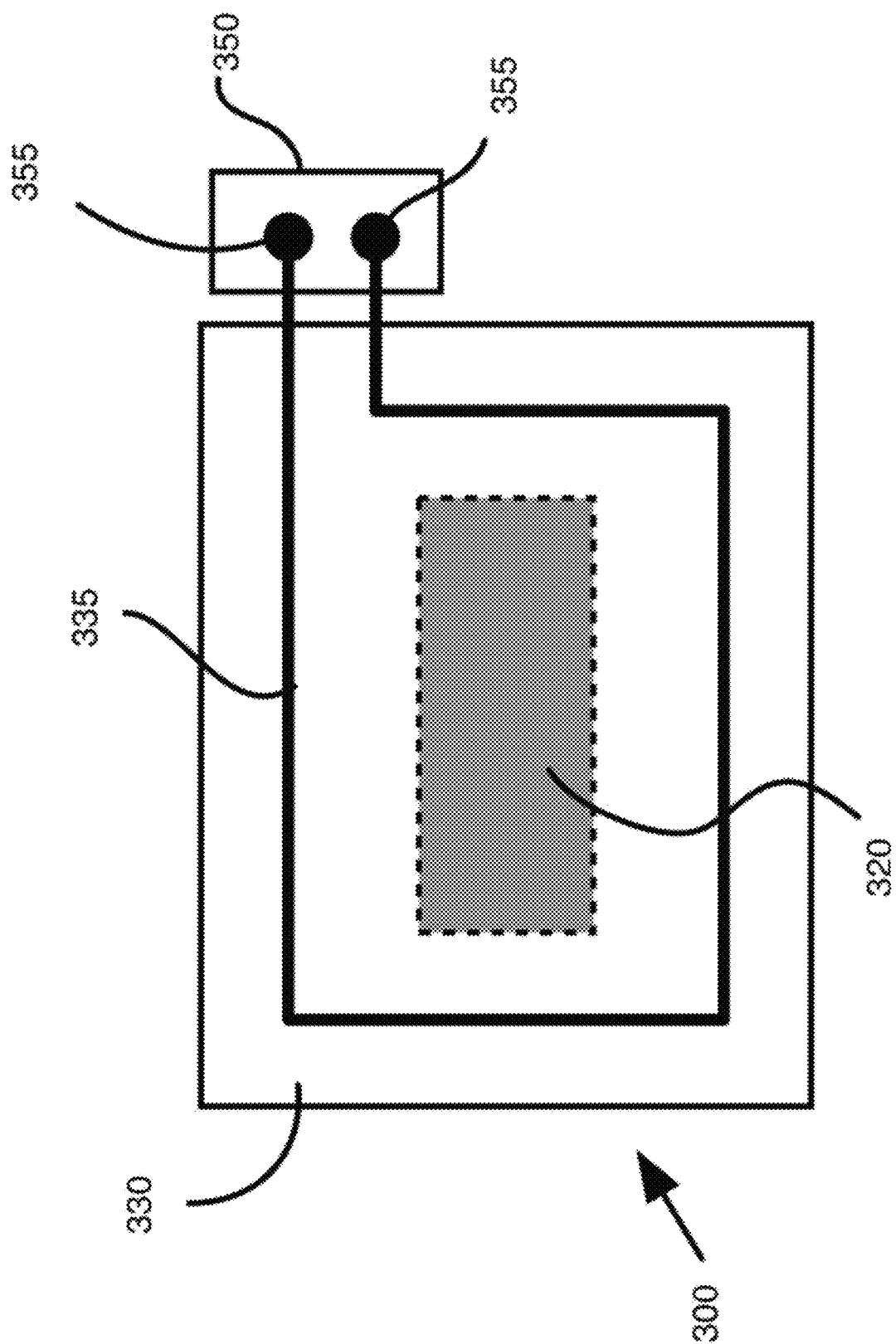
FIG. 3 depicts a simplified example top-down view of an IHS with a heating element, in accordance with various embodiments.

FIG. 3 depicts a simplified example top-down view of an IHS with a heating element, in accordance with various embodiments. Specifically, FIG. 3 depicts a highly simplified view intended to depict an example routing configuration of the heating element within the IHS. In FIG. 3, a microelectronic package 300 may include an IHS 330 with a heating element 335, which may be respectively similar to, and share one or more characteristics of, IHS 130 and heating element 135. The microelectronic package 300 may further include a STIM 320, which may be similar to, and share one or more characteristics of, STIM 120. It will be understood that the STIM 320 is shown depicted with dashed lines to show relative placement, and generally the STIM 320 and the heating element 335 may not be coplanar (e.g., as depicted in FIG. 1 or 2).

The heating element may include a port 350, which may be similar to, and share one or more characteristics of, port 250. The port 350 may include terminals 355. As an example, one of the terminals 355 may be a positive terminal and the other of the terminals 355 may be a negative terminal. The terminals 355 may be configured to couple with a power source (e.g., power sources 140 or 240) to provide power to the heating element 335.

Generally, the heating element 335 may be positioned in the IHS 330 such that it is not positioned "over" the STIM 320. Rather, the heating element 335 may generally surround the STIM 320. This configuration may be preferable in situations where the STIM 320 is particularly sensitive to direct heat, or situations where it may be desirable to perform reflow on the periphery of the STIM 320 while leaving the central portion of the STIM 320 relatively unaffected.

Figure 4:
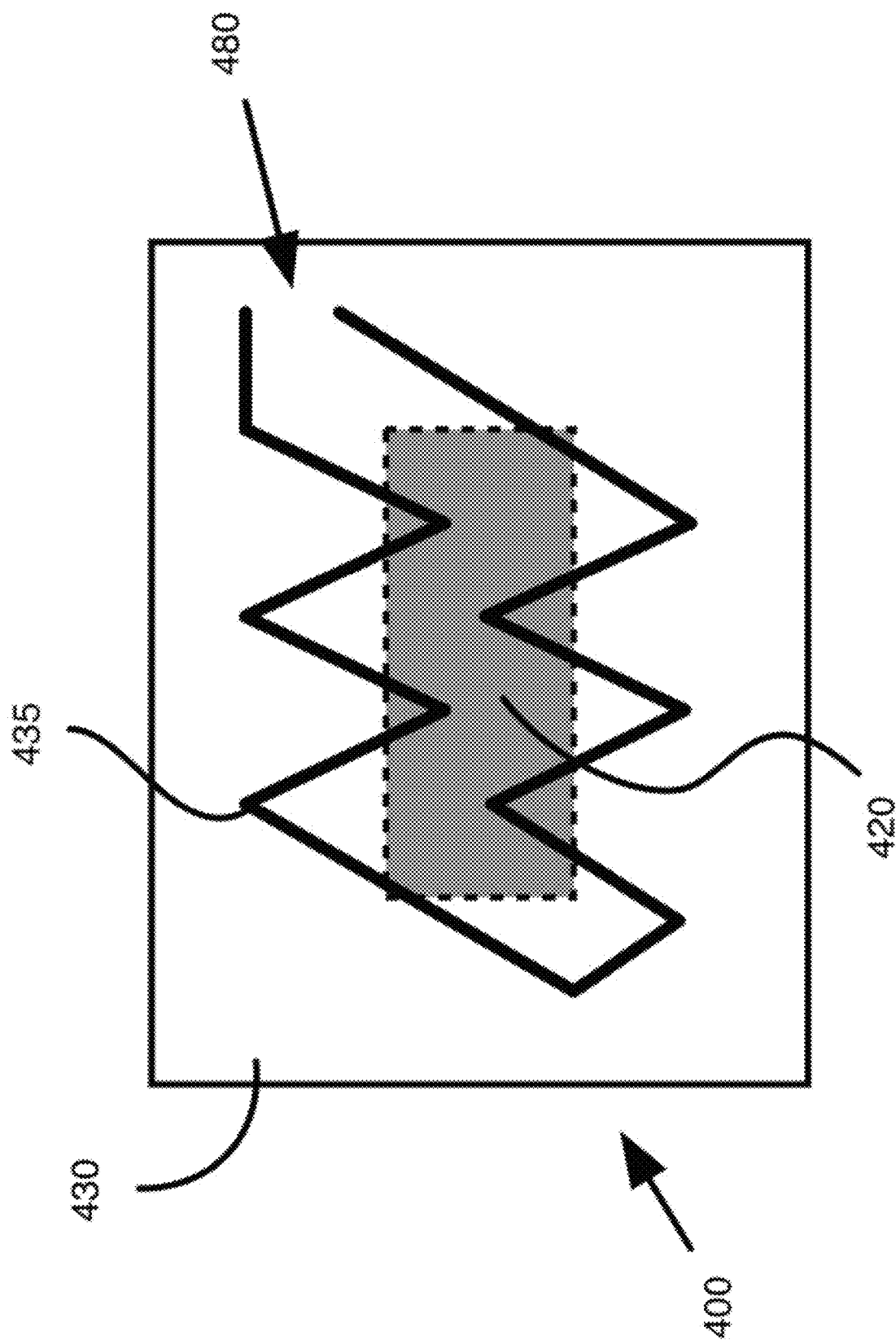
FIG. 4 depicts an alternative simplified example top-down view of an IHS with a heating element, in accordance with various embodiments.

FIG. 4 depicts an alternative simplified example top-down view of an IHS with a heating element, in accordance with various embodiments. Specifically, FIG. 4 depicts a microelectronic package 400 that includes an IHS 430, a STIM 420, and a heating element 435 which may be respectively similar to, and share one or more characteristics of, IHS 330, STIM 320, and heating element 335.

In. FIG. 4, the heating element 435 may not couple to a power source through a port such as port 350. Rather, the heating element 435 may couple with the power source through an element of the microelectronic package 400 and, more particularly, an element of a package substrate to which the IHS 430 is coupled. Such an element may be, for example, an interconnect such as interconnect 105. Therefore, a port or terminals such as port 350 or terminals 355 may not be depicted in FIG. 4. Rather, the heating element 435 may turn generally downward at location 480 to join with an element of the microelectronic package 400 so that the heating element 435 may have a shape as viewed from the side similar to that of heating element 135.

In the embodiment of FIG. 4, the heating element 435 may have a more complicated shape than the embodiment of FIG. 3. Specifically, the heating element 435 may have a "zig-zag" type pattern so that it at least partially overlaps the STIM 420. This configuration may be desirable, for example, if more even heating of the STIM 420 may be desirable.

Similarly to FIGS. 1 and 2, it will be understood that the embodiments of FIGS. 3 and 4 are intended as examples of various embodiments, and variations may be present in other embodiments. For example, the relative sizes or shapes of various elements such as the STIM, the heating elements, etc. may be different in different embodiments. The shapes of the heating elements 335 and 435 are intended as examples, but in other embodiments the heating elements 335 or 435 may have different shapes such as wave patterns, being circular, at least partially overlapping, etc. Additionally, the number of heating elements, the number of STIMs, etc. may differ in other embodiments. As previously noted with respect to port 250, the specific location and configuration of the port 350 may be different in other embodiments. For example, there may be additional or fewer terminals, the port 350 may be at least partially within, or fully within, the IHS 330, etc. Finally, elements of FIGS. 3 and 4 may be combined with one another in various embodiments. Other variations may be present in other embodiments.

FIG. 5 depicts an example technique for manufacturing a microelectronic package that includes an IHS with a heating element, in accordance with various embodiments. Generally, the technique of FIG. 5 may be described with respect to the microelectronic package 100 of FIG. 1, however it will be understood that the technique may be applicable to other embodiments of tis disclosure.

The technique may include identifying, at 505, an IHS that includes a face. The IHS may be, for example, similar to IHS 130. The face may be, for example, the face 103 of the IHS 130 that is facing the die 115 and the STIM 120. The IHS may further include a heating element that is to heat an area adjacent to the face. The heating element may be, for example, heating element 135. Identifying the IHS may be an automatic selection as may be made by an electronic device in a manufacturing facility, or it may be a more discrete operation such as identifying the IHS by a human in a manufacturing facility.

The technique may further include thermally coupling, at 510, the IHS to a TIM such that the face of the IHS is facing the TIM. The TIM may be similar to, for example, STIM 120 of FIG. 1.

Figure 6:
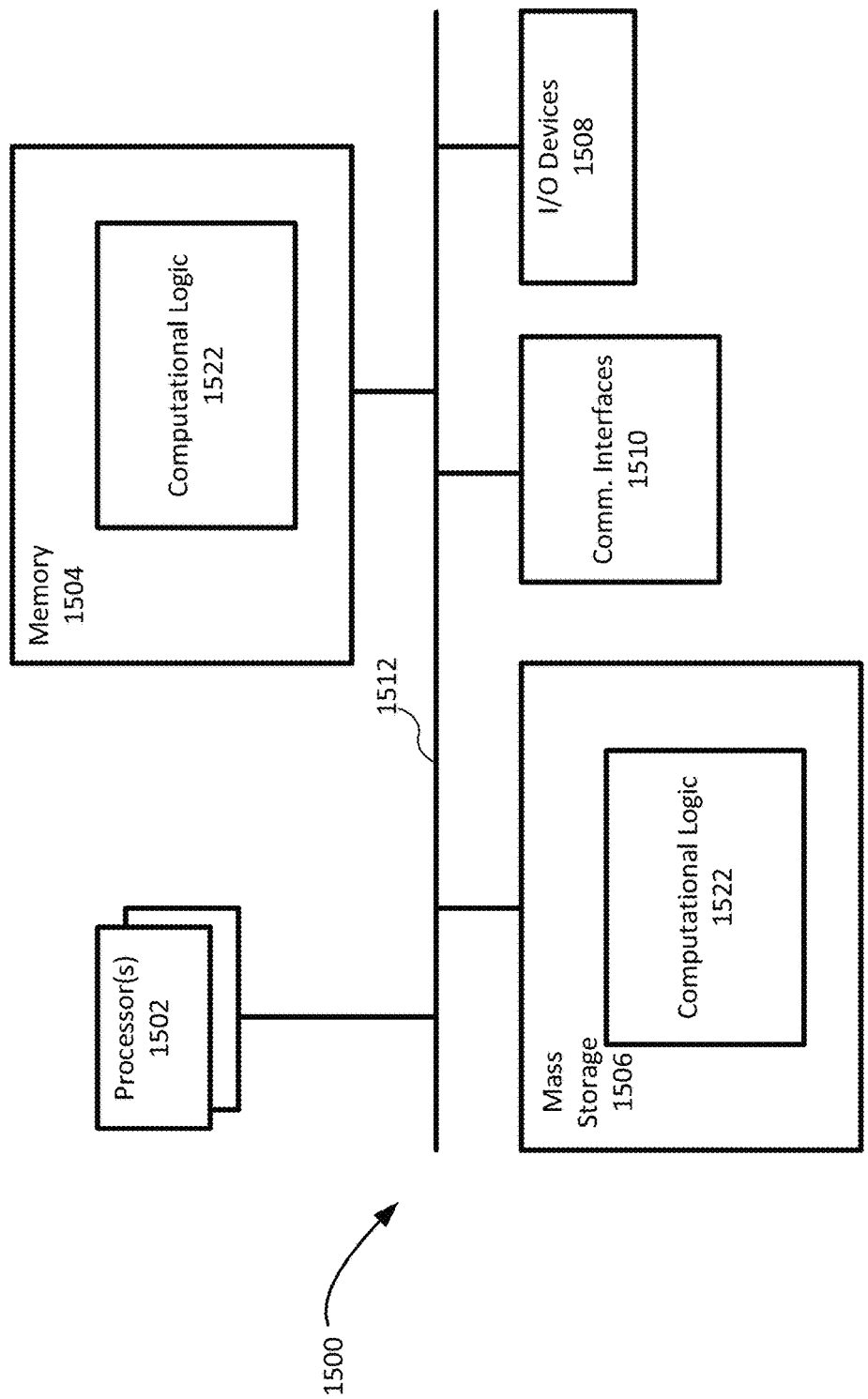
FIG. 6 illustrates an example device that may use various embodiments herein, in accordance with various embodiments.

FIG. 6 illustrates an example computing device 1500 suitable for use with microelectronic packages 100, 200, 300, or 400 (collectively, "packages 100-400"), in accordance with various embodiments. Specifically, in some embodiments, the computing device 1500 may include one or more of packages 100-400 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (IO) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of packages 100-400. For example, in some embodiments a die of a microelectronic package such as dies 115 or 215 may be a processor 1502, memory 1504, or some other component of the computing device 1500. An IHS such as IHS 130 or some other IHS may be coupled with the element of the computing device 1500.

Examples of Various Embodiments

Example 1 includes a microelectronic package comprising: a die coupled with a package substrate; and a lid coupled with the package substrate such that the die is positioned between the lid and the package substrate, wherein the lid includes a heating element that is to heat an area between the lid and the die.

Example 2 includes the microelectronic package of example 1, wherein the microelectronic package further comprises a thermal interface material.

Example 3 includes the microelectronic package of example 2, wherein the thermal interface material is a solder thermal interface material (STIM).

Example 4 includes the microelectronic package of example 2, wherein the heating element is to heat the thermal interface material.

Example 5 includes the microelectronic package of any of examples 1-4, wherein the lid is thermally coupled with the die such that the lid is to receive thermal energy from the die.

Example 6 includes the microelectronic package of any of examples 1-4, wherein the heating element is communicatively coupled with a power source by an element of the package substrate that is coupled with the lid.

Example 7 includes the microelectronic package of any of examples 1-4, wherein the heating element is communicatively coupled with a power source by a port in the lid.

Example 8 includes an integrated heat spreader (IHS) for use in a microelectronic package, wherein the IHS includes: a first side that is to face of a die of the microelectronic package when the IHS is coupled with a package substrate of the microelectronic package; a second side that is opposite the first side; and a heating element positioned between the first side and the second side, wherein the heating element is to heat an area adjacent to the first side of the IHS.

Example 9 includes the IHS of example 8, wherein the heating element is a wire.

Example 10 includes the IHS of example 9, wherein the wire includes copper.

Example 11 includes the IHS of example 8, wherein the heating element, when the IHS is coupled with the package substrate, is positioned at a periphery of the die such that the heating element is not adjacent to the die as measured in a direction perpendicular to the first side of the IHS.

Example 12 includes the IHS of example 8, wherein the heating element, when the IHS is coupled with the package substrate, is positioned at a portion of the IHS that is adjacent to the die as measured in a direction perpendicular to the first side of the IHS.

Example 13 includes the IHS of any of examples 8-12, wherein the heating element is to couple with a power source external to the IHS.

Example 14 includes the IHS of any of examples 8-12, wherein the IHS is to thermally and physically couple with a solder thermal interface material (STIM) of the package substrate, and wherein the heating element is to heat the STIM.

Example 15 includes a method of forming a microelectronic package, wherein the method comprises: identifying an integrated heat spreader (IHS) that includes a face, wherein the IHS further includes a heating element that is to heat an area adjacent to the face; and thermally coupling the IHS to a thermal interface material (TIM) such that the face of the IHS is facing the TIM.

Example 16 includes the method of example 15, wherein the TIM is a solder TIM (STIM).

Example 17 includes the method of example 15, wherein the method further comprises electrically coupling the heating element to an interconnect of the microelectronic package.

Example 18 includes the method of example 17, wherein the interconnect is communicatively coupled with a power line of a package substrate of the microelectronic package, and wherein the power line is to transfer power from a power source coupled with the package substrate to the interconnect.

Example 19 includes the method of example 15, wherein the IHS includes a port, and wherein the method further comprises coupling the heating element, through the port, to a power source.

Example 20 includes the method of any of examples 15-19, wherein the heating element, when activated, is to cause at least partial reflow of the TIM.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package, comprising:
a die coupled with a package substrate;
a lid coupled with the package substrate, wherein the die is between the lid and the package substrate, and wherein the lid includes a heating element; and
a thermal interface material between the lid and the die, wherein a projection of the heating element onto the package substrate surrounds a projection of the thermal interface material onto the package substrate.

2. The microelectronic package of claim 1, wherein the thermal interface material is a solder thermal interface material (STIM).

3. The microelectronic package of claim 1, wherein the heating element is to heat the thermal interface material.

4. The microelectronic package of claim 1, wherein the package substrate includes an element to electrically connect the heating element with a power source.

5. The microelectronic package of claim 1, wherein the lid includes a port to electrically connect the heating element with a power source.

6. The microelectronic package of claim 1, wherein the heating element has at least one of: a zig-zag pattern, a wave pattern, a circular pattern, a curve, or a bend.

7. The microelectronic package of claim 1, wherein:
the lid has a first side and a second side that is opposite the first side,
the first side of the lid faces the die, and
a distance between the first side of the lid and a first portion of the heating element is different from a distance between the first side of the lid and a second portion of the heating element.

8. The microelectronic package of claim 1, wherein the heating element is to heat an area between the lid and the die.

9. An integrated heat spreader (IHS) for use in a microelectronic package, the IHS comprising:
a first side that is to face of a die of the microelectronic package when the IHS is coupled with a package substrate of the microelectronic package;
a second side that is opposite the first side; and
a heating element between the first side and the second side, wherein a distance between the first side of the IHS and a first portion of the heating element is different from a distance between the first side of the IHS and a second portion of the heating element.

10. The IHS of claim 9, wherein the heating element is a wire.

11. The IHS of claim 10, wherein a diameter of the wire is between 30 micrometers and 300 micrometers.

12. The IHS of claim 9, wherein, when the IHS is coupled with the package substrate:
a thermal interface material is between the IHS and the die, and
a projection of the heating element onto the package substrate surrounds a projection of the thermal interface material onto the package substrate.

13. A method of forming a microelectronic package, the method comprising:
thermally coupling a first face of an integrated heat spreader (IHS) to a thermal interface material (TIM) such that the first face of the IHS is facing the TIM, wherein the IHS further includes a heating element, wherein a distance between the first face of the IHS and a first portion of the heating element is different from a distance between the first face of the IHS and a second portion of the heating element.

14. The method of claim 13, further comprising electrically coupling the heating element to an interconnect of the microelectronic package, wherein the interconnect is electrically connected with a power line of a package substrate of the microelectronic package.

15. The method of claim 13, wherein the IHS includes a port, and wherein the method further comprises coupling the heating element, through the port, to a power source.

16. The method of claim 13, wherein the heating element, when activated, is to cause at least partial reflow of the TIM.

17. The method of claim 13, further comprising coupling the IHS to a package substrate, wherein a projection of the heating element onto the package substrate surrounds a projection of the TIM onto the package substrate.

18. The method of claim 13, wherein the TIM is a solder TIM.

19. A microelectronic package, comprising:
- a die coupled with a package substrate; and
- a lid coupled with the package substrate, wherein:
- the die is between the lid and the package substrate,
- the lid has a first side and a second side that is opposite the first side,
- the first side of the lid faces the die,
- the lid includes a heating element, and
- a distance between the first side of the lid and a first portion of the heating element is different from a distance between the first side of the lid and a second portion of the heating element.

20. The microelectronic package of claim 19, further comprising a thermal interface material between the lid and the die.

\* \* \* \* \*